United States Patent [19]

Kawamura

[11] Patent Number: 5,481,559
[45] Date of Patent: Jan. 2, 1996

[54] LIGHT MODULATOR INTEGRATED LIGHT-EMITTING DEVICE AND METHOD OF MANUFACTURING THE SAME

[75] Inventor: Hiromitsu Kawamura, Kawasaki, Japan

[73] Assignee: Fujitsu Limited, Kawasaki

[21] Appl. No.: 356,120

[22] Filed: Dec. 15, 1994

[30] Foreign Application Priority Data

Jan. 31, 1994 [JP] Japan ................................ 6-009879

[51] Int. Cl.⁶ .................................................. H01S 3/10
[52] U.S. Cl. ............................. 372/50; 372/26; 372/28
[58] Field of Search .......................... 372/50, 26, 28, 372/48, 96

[56] References Cited

U.S. PATENT DOCUMENTS

| | | | |
|---|---|---|---|
| 4,720,835 | 1/1988 | Akiba et al. | 372/50 |
| 5,023,878 | 6/1991 | Berthold et al. | 372/50 |
| 5,252,839 | 10/1993 | Fouquet | 372/48 |
| 5,325,382 | 6/1994 | Emura et al. | 372/96 |
| 5,349,598 | 9/1994 | Ouchi et al. | 372/26 |

OTHER PUBLICATIONS

M. Suzuki et al., "Electrical and Optical Interactions Between Integrated InGaAsP/InP DFB Lasers and Electro-absorption Modulators", Journal of Lightwave Technology, vol. 6, No. 6, Jun. 1988.

*Primary Examiner*—Rodney B. Bovernick
*Assistant Examiner*—Yisun Song
*Attorney, Agent, or Firm*—Staas & Halsey

[57] ABSTRACT

A light modulator integrated light-emitting device is provided with a light-emitting element formed on a semiconductor substrate, a light modulation element formed on the semiconductor substrate and which is optically connected to the light-emitting element, a laser electrode formed on the light-emitting element, a light modulation electrode formed on the light modulation element, and a ground electrode that is formed between the laser electrode and the light modulation electrode in an electrically isolated state with respect to these electrodes and applied with constant voltage.

7 Claims, 14 Drawing Sheets

LIGHT MODULATOR INTEGRATED LIGHT-EMITTING DEVICE AND METHOD OF MANUFACTURING THE SAME

BACKGROUND OF THE INVENTION

1. Field of the Invention

The present invention relates to a light modulator integrated light-emitting device and a method of manufacturing the same, and more specifically to improvement of a semiconductor device, in which a semiconductor laser element and a light modulator are integrated, for using in an optical communication system.

2. Description of the Related Art

As a distance gets longer and capacity gets larger in an optical communication system, a transmission characteristic of 2.5 Gb/s is required in a communication line of 100 Km or longer, it is expected in the system that a light modulator integrated light-emitting device is put to practical use.

A light modulator integrated light-emitting device such as described in the JOURNAL OF LIGHTWAVE TECHNOLOGY [M. Suzuki et al., Vol. 6, No. 6, June 1988] has a light-emitting element 2 and a light modulation element 3 provided adjacent to the light-emitting element 2 on a semiconductor substrate 1 having a common electrode 1A as shown in FIG. 1. The light-emitting element 2 has a laser electrode 2A for supplying an electric current for generating the laser light, and the light modulation element 3 has a modulation electrode 3A for supplying a signal for laser modulation.

Next, the operation of the light modulator integrated light-emitting device will be described. First, when a driving current is supplied to the light-emitting element 2 from a constant current source connected between the common electrode 1A and the laser electrode 2A, a laser light is generated in the light-emitting element 2. Further, when a modulation signal is supplied to the modulation electrode 3A from a signal source connected between the common electrode 1A and the modulation electrode 3A, the laser light from the light-emitting element 2 is intensity-modulated by the Franz-Keldysh effect. The modulated light with the above is propagated to an optical fiber or the like from the device concerned.

Now, in a light modulator integrated light-emitting device according to a prior art, the boundary region between the light-emitting element 2 and the light modulation element 3 is separated electrically by means of a semi-insulating semiconductor, and the resistance of this separated region is normally several KΩ or higher.

However, when a separation distance between the laser electrode 2A of the light-emitting element 2 and the modulation electrode 3A of the light modulation element 3 gets shorter as micronization and integration of the semiconductor device advance, electrical separation gets weaker. As a result, electromagnetic induction is generated between the laser electrode 2A and the modulation electrode 3A, and a high frequency signal induced into the laser electrode 2A from the modulation electrode 3A exerts a bad influence upon the constant current supplied to the laser electrode 2A. For example, the current supplied to the light-emitting element 2 varies, fluctuation is caused in the oscillation wavelength of the laser light, and the modulated light becomes unstable.

The foregoing is an obstacle for long distance and large capacity transmission in an optical communication system, thus lowering the reliability. Besides, the more the modulation signal having a high frequency is supplied to the modulation electrode 3A, the more easily the electromagnetic induction is generated. The electromagnetic induction is also affected by a bonding wire connecting respective electrodes 2A and 3A with input terminals, arrangement of respective electrodes and the frequency of the modulation signal.

SUMMARY OF THE INVENTION

It is an object of the present invention to provide a light modulator integrated light-emitting device for preventing a high frequency signal that is being induced from an electrode for light modulation to an electrode for generating laser light, having a light-emitting element operate stably, and outputting a modulated light having an oscillation wavelength with no fluctuation, and a method of manufacturing the device.

A light modulator integrated light-emitting device of the present invention is provided with a light-emitting element formed on a semiconductor substrate, a light modulation element formed on the semiconductor substrate and which is optically connected to the light-emitting element, a first electrode formed on the light-emitting element, a second electrode formed on the light modulation element and a third electrode to which constant voltage is applied. The third electrode is formed on a part of semiconductor layer, the part which is on the light modulation element, and in a state that it is electrically separated, between the first electrode and the second electrode, with respect to these electrodes.

The third electrode is formed through an insulating film on a semiconductor layer formed in both regions of the light-emitting element and the light modulation element. The third electrode is formed in direct contact with the top of the semiconductor layer formed in both regions of the light-emitting element and the light modulation element.

When such third electrode is connected to a common electrode and to ground, the boundary region between the light-emitting element and the light modulation element is shielded electrostatically, and, even when the separation distance between the first electrode for the laser light-emitting element and the second electrode for the light modulation element is reduced, electrical separation is intensified by means of the third electrode, thus making it possible to sufficiently cope with micronization and high integration of a semiconductor device.

Further, since the current for laser light generation is supplied stably to the light-emitting element through the second electrode, a laser light having a stable oscillation wavelength with no fluctuation is obtainable from the light modulation element.

A method of manufacturing a light modulator integrated light-emitting device according to the present invention includes processes of locally removing a semiconductor layer containing impurities extending over both light-emitting element and light modulation element formed on a semiconductor substrate so as to form an element isolation groove, forming an insulating film in the element isolation Groove of the semiconductor substrate, and forming conductive films on the semiconductor layer containing impurities of the light-emitting element, on the semiconductor layer containing impurities of the light modulation element, and on the insulating film, respectively.

Through such processes, it is possible to form, conforming to formation of the electrode for the laser light-emitting element and the electrode for the light modulation element, the electrode for application of constant voltage located on the insulating film between these two electrodes at the same time.

With this, there is provided a light modulator integrated light-emitting device of high reliability, and it is possible to transmit information at a transmission rate of 2.5 Gb/s or higher in a long distance communication line of 100 Km or longer, thus contributing largely to the improvement of an optical communication system.

BRIEF DESCRIPTION OF THE DRAWINGS

FIG. 9A is a sectional view for explaining a DFB laser element and a light modulation element of the light modulator integrated light-emitting device shown in FIG. 5;

FIG. 9B is a sectional view showing the light modulator integrated light-emitting device shown in FIG. 9A with an opening portion opened on an n-InP substrate;

FIG. 9C is a sectional view showing the opening portion in the n-InP substrate shown in FIG. 9B with a contact layer thereof removed;

FIG. 9D is a sectional view showing the opening portion in the n-InP substrate shown in FIG. 9C with an SiO$_2$ film formed therein;

FIG. 9E is a sectional view showing the SiO$_2$ film on the n-InP substrate shown in FIG. 9D removed partially;

FIG. 9F is a sectional view in which a Ti film, a Pt film and an Au film are grown on the n-InP substrate shown in FIG. 9E, respectively;

FIG. 9G is a sectional view in which patterning of a resist film is applied on the Au film on the n-InP substrate shown in FIG. 9F;

FIG. 9H is a sectional view in which the Ti film, the Pt film and the Au film on the n-InP substrate shown in FIG. 9G are partially removed, respectively;

FIG. 10A is a sectional view of the light modulator integrated light-emitting device shown in FIG. 5 as seen from the outgoing side of the laser light thereof;

FIG. 10B is a sectional view in which an opening portion is formed in the n-InP substrate of the light modulator integrated light-emitting device shown in FIG. 9B;

FIG. 10C is a sectional view in which a contact layer of the opening portion of the n-InP substrate shown in FIG. 9C has been removed;

FIG. 10D is a sectional view in which a SiO$_2$ film is formed in the opening portion of the n-InP substrate shown in FIG. 9D;

FIG. 11A is a sectional view in which an opening portion is formed on the n-InP substrate shown in FIG. 9E;

FIG. 11B is a sectional view in which a Ti film, a Pt film and an Au film are grown on the n-InP substrate shown in FIG. 11A, respectively;

FIG. 11C is a sectional view in which patterning of a resist film is applied onto the Au film of the n-InP substrate shown in FIG. 11B;

FIG. 11D is a sectional view in which the Ti film, the Pt film and the Au film on the n-InP substrate shown in FIG. 11C are partially removed, respectively.

DETAILED DESCRIPTION OF THE INVENTION

Figure 1:
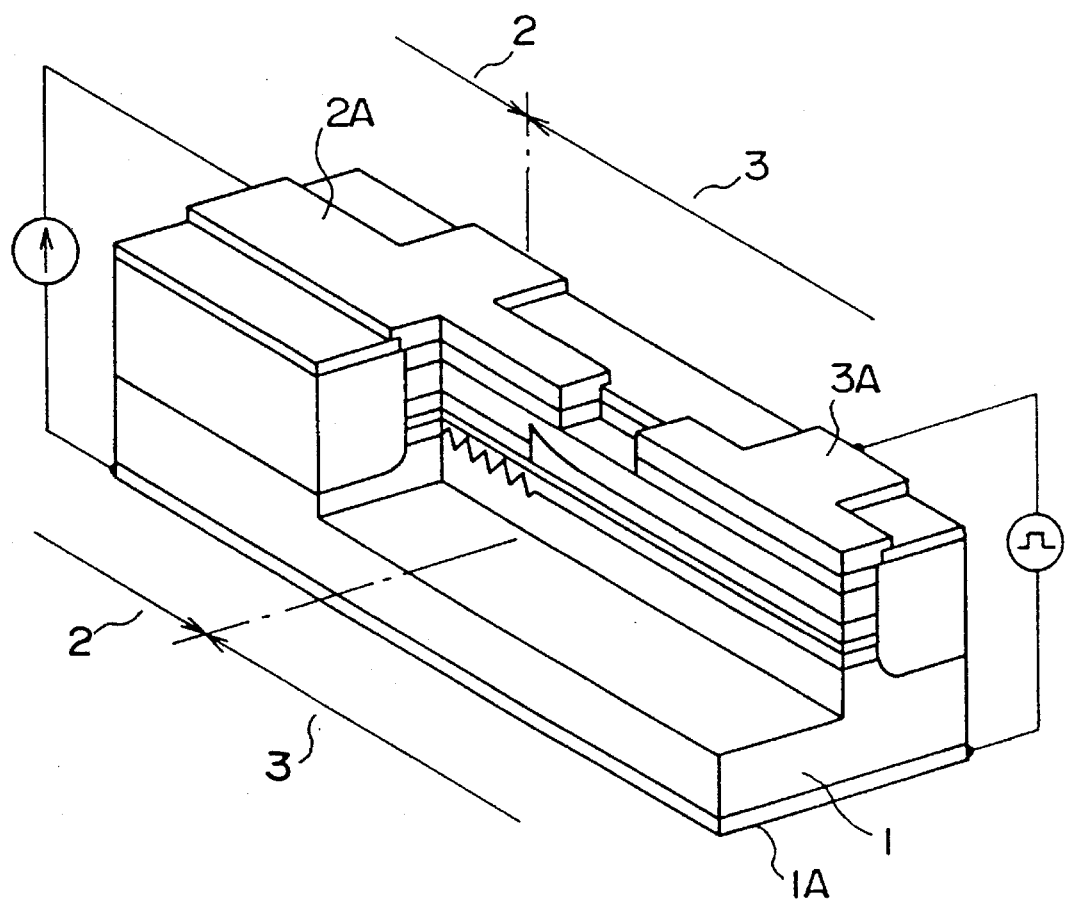
FIG. 1 is a perspective view for explaining a light modulator integrated light-emitting device according to a conventional example.
Figure 2:
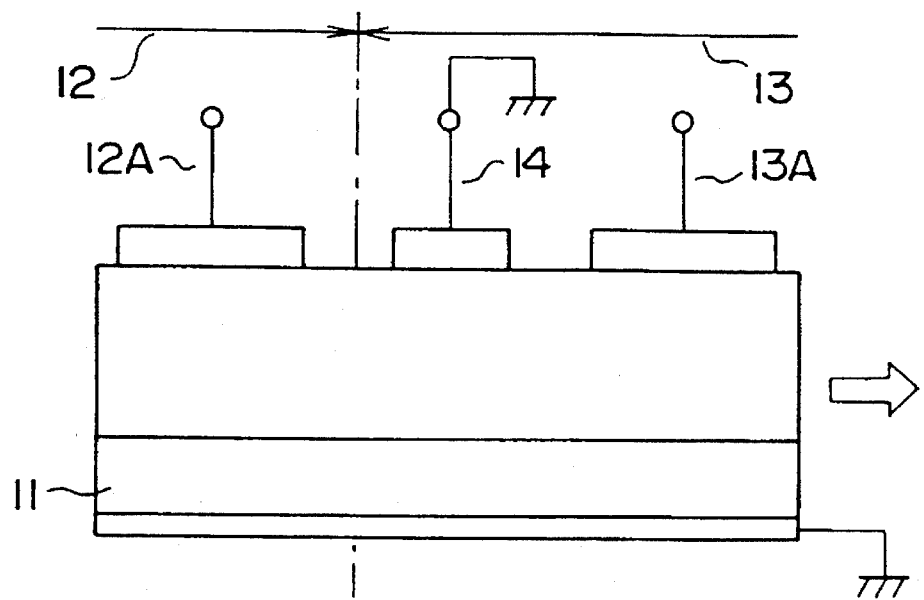
FIG. 2 is a block diagram of a light modulator integrated light-emitting device in principle according to the present invention.

A light modulator integrated light-emitting device in principle of the present invention is provided with a light-emitting element 12 formed on a semiconductor substrate 11, a light modulation element 13 formed on the semiconductor substrate 11 and which is optically connected to the light-emitting element 12, a first electrode 12A formed on the light-emitting element 12, a second electrode 13A formed on the light modulation element 13 and a third electrode 14 to which constant voltage is applied as shown in FIG. 2. The third electrode 14 is formed on a part of semiconductor layer 11A, the part which is on the light modulation element 13, and in a state that, between the first electrode 12A and the second electrode 13A, it is electrically separated from these electrodes 12A and 13A.

Figure 3:
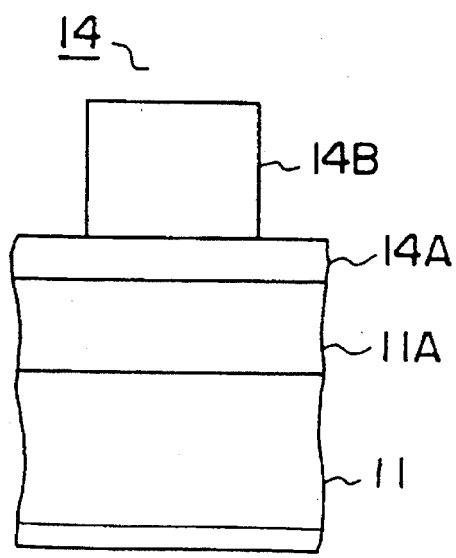
FIG. 3 is a sectional view for explaining the relationship between a third electrode and a substrate in the light modulator integrated light-emitting device shown in FIG. 2.

The third electrode 14 is formed through an insulating film 14A on a semiconductor layer 11A formed on both regions of the light-emitting element 12 and the light modulation element 13 as shown in FIG. 3.

Figure 4:
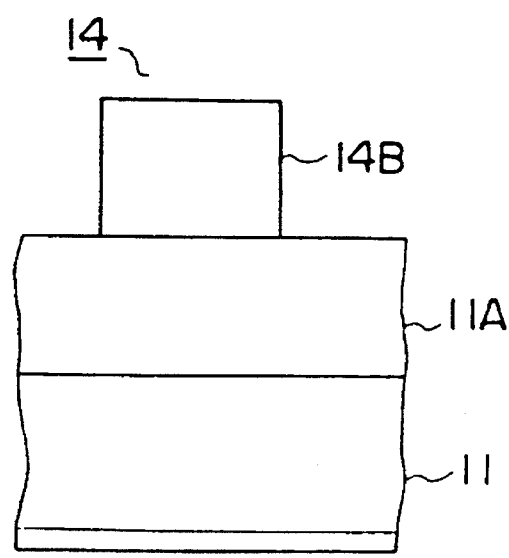
FIG. 4 is a sectional view for explaining another relationship between a third electrode and a substrate of the light modulator integrated light-emitting device shown in FIG. 2.

The third electrode 14 is formed in direct contact with the top of the semiconductor layer 11A formed over both regions of the light-emitting element 12 and the light modulation element 13 as shown in FIG. 4.

Figure 5:
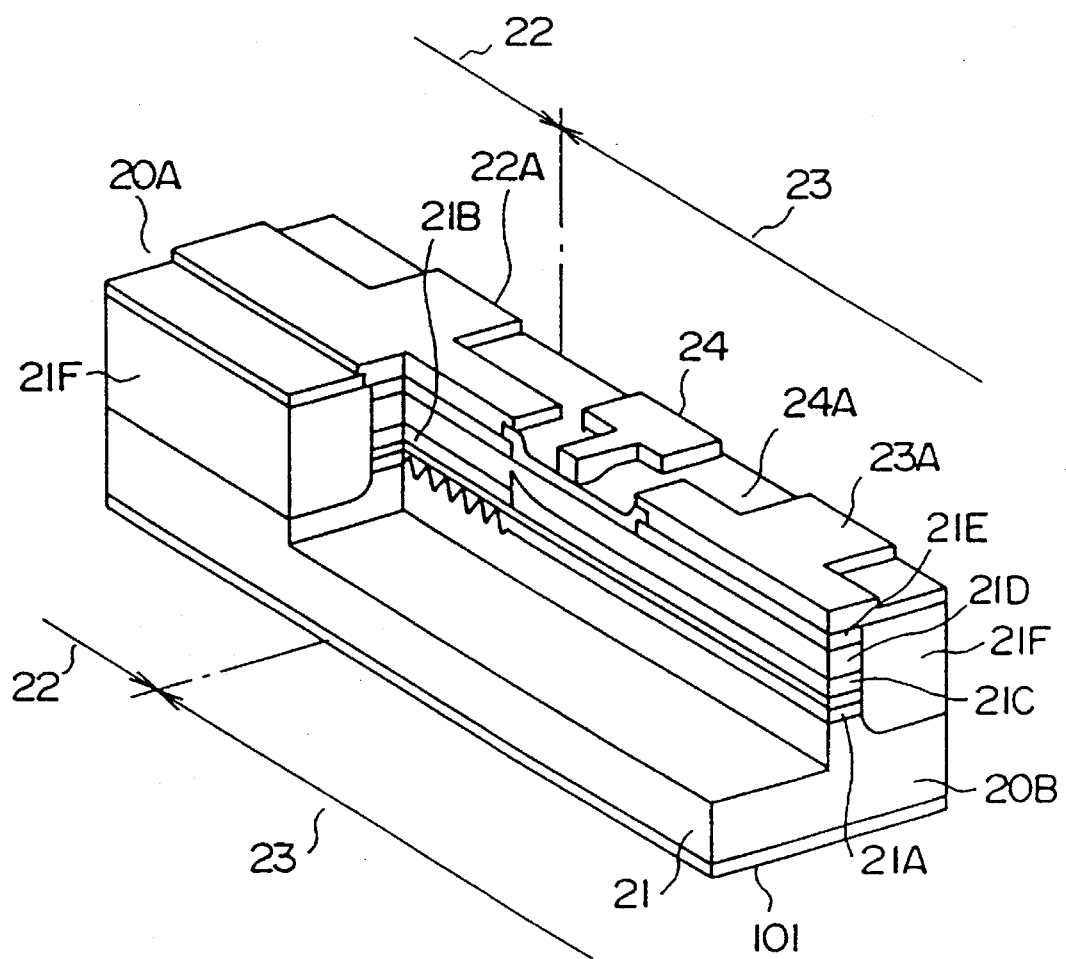
FIG. 5 is a perspective view for explaining a structure of a light modulator integrated light-emitting device according to a first preferred embodiment of the present invention.
Figure 6:
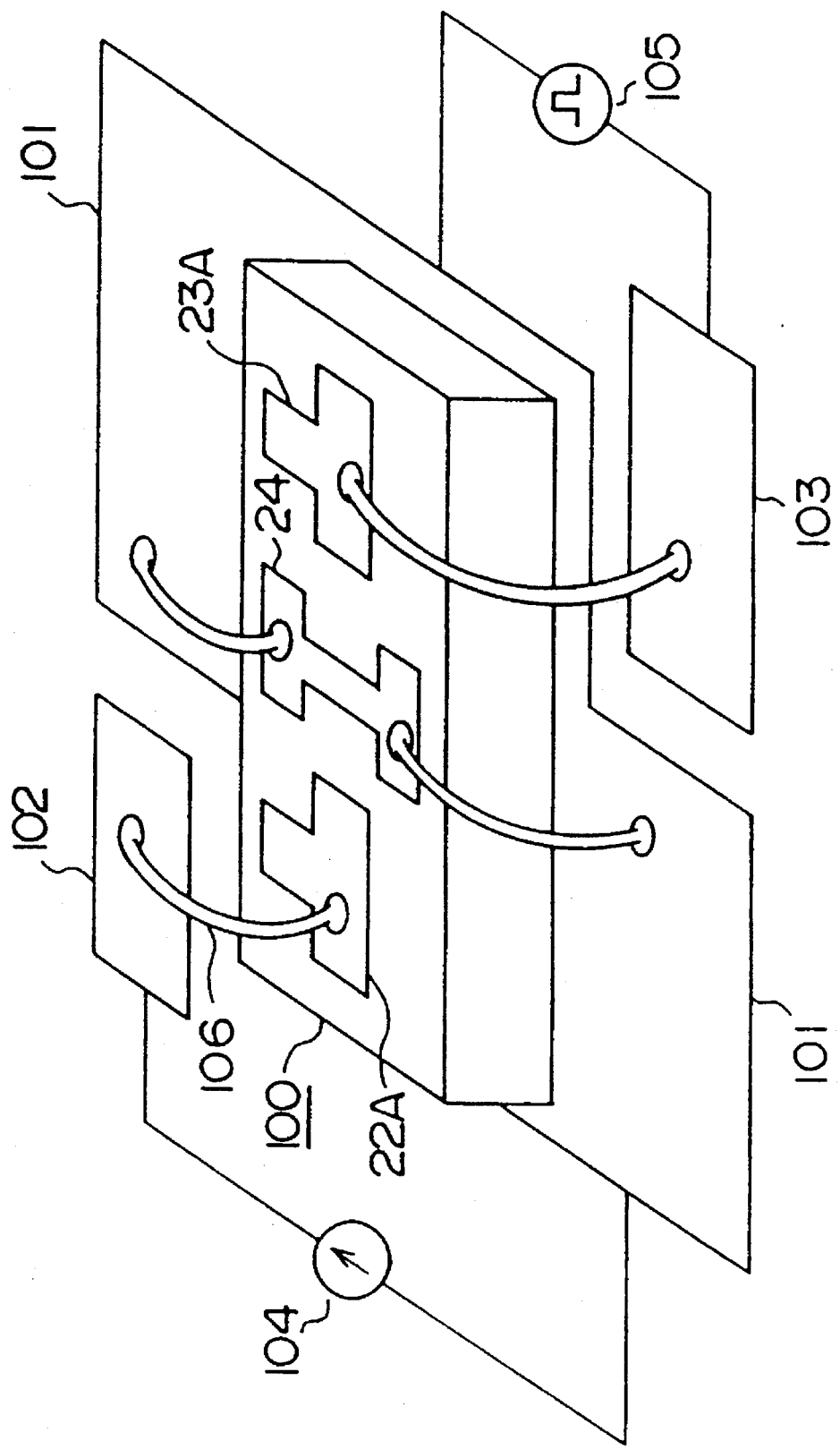
FIG. 6 is a wiring diagram of a laser electrode, a light modulator electrode and a ground electrode of the light modulator integrated light-emitting device shown in FIG. 5.

Besides, a common electrode 101 is formed under the semiconductor substrate 21 as shown in FIG. 5. For example, the third electrode 24 is connected to the common electrode 101 and to ground as shown in FIG. 6.

As shown in FIG. 5, a first electrode 22A is formed on a contact layer 21E of a light-emitting element 22, a second electrode 23A is formed on the contact layer 21E of a light modulation element 23, the contact layer 21E under the first and the second electrodes 22A and 23A is electrically separated at the boundary region, and the third electrode 24 is formed on a semiconductor layer 21D in the isolated boundary region through an insulating layer 24A.

A method of manufacturing a light modulator integrated light-emitting device in principle of the present invention includes, as shown with a preferred embodiment in FIG. 9A to FIG. 9H, processes of locally removing a semiconductor layer 21E containing impurities extending over both light-emitting element 22 and light modulation element 23 formed on a semiconductor substrate 21 so as to form an element isolation groove, forming an insulating film 24A in the element isolation groove of the semiconductor substrate, and forming conductive films 28, 29 and 30 on the semiconductor layer 21E containing impurities of the light-emitting element 22, on the semiconductor layer 21E containing impurities of the light modulation element 23, and on the insulating film 24A of the semiconductor substrate 21, respectively.

To be more precise, there are included steps of forming a first insulating film 21G on the impurity semiconductor layer 21E located in the light-emitting element region, the light modulation element region and the boundary region therebetween, forming a first opening portion 25 that exposes the impurity semiconductor layer 21E on the impurity semiconductor layer 21E in the boundary region by applying patterning to the first insulating film 21G, removing the impurity semiconductor layer 21E exposed through the first opening portion 25 so as to expose the semiconductor layer 21D thereunder, forming a second insulating film 24A on the semiconductor layer in the first opening portion 25 where the impurity semiconductor layer 21E has been removed and the first insulating film 21G, applying patterning to the first insulating film 21G and the second insulating film 24A so as to form a second opening portion 26 and a third opening portion 27 that expose the semiconductor layer 21D located in the light-emitting element region and the light modulation element region other than the boundary region, respectively, forming the conductive films 28, 29 and 30 on the second insulating film 24A and on the semiconductor layer 21D in the second opening portion 26 and the third opening portion 27, forming a first electrode 22A in the light-emitting element region and a second electrode 23A in the light modulation element region, and forming a third electrode 24 separately between the first electrode 22A and the second electrode 23A at the same time by applying patterning to the conductive films 28, 29 and 30.

According to the light modulator integrated light-emitting device of the present invention, there is provided, as shown in FIG. 2, the third electrode 14 for ground connection in the boundary region between the first electrode 12A of the light-emitting element 12 and the second electrode 13A of the light modulation element 13. Thus, it is possible to shield between the light-emitting element 12 and the light modulation element 13 electrostatically, for example, by connecting the third electrode 14 such as shown in FIG. 3 or FIG. 4 to the common electrode and to ground. The structure thereof is such that the third electrode 14 is united with a semiconductor layer 11A through an insulating film 14A as shown in FIG. 3. Or, as shown in FIG. 4, the electrode 14 is united directly with the semiconductor layer 11A.

Such a structure being adopted, electromagnetic induction is no longer generated between the first electrode 12A and the second electrode 13A even when the isolation distance between the first electrode 12A and the second electrode 13A is reduced in accordance with the requirements for micronization and high integration of the semiconductor device.

With this, it is possible to supply the electric current for laser generation stably to the light-emitting element 12 through the first electrode 12A, and thereby to obtain a modulated light having a stable oscillation wavelength with no fluctuation from the light modulation element 13.

According to the method of manufacturing the light modulator integrated light-emitting device of the present invention, there are provided steps of forming the conductive films 28, 29 and 30 on the impurity semiconductor layer 21E of the light-emitting element 22, on the impurity semiconductor layer 21E of the light modulation element 23, and on the insulating film 24A formed extending over regions of both the light-emitting element 22 and the light modulation element 23, respectively.

As a result, it is possible, by applying patterning to the conductive films 28, 29 and 30, to form the first electrode 22A for supplying the electric current for laser light generation on the semiconductor layer 21E in the light-emitting element region, to form the second electrode 23A for supplying a signal for laser light modulation on the semiconductor layer 21E in the light modulation element region, and to form the third electrode 24 on a semiconductor layer 21D of the semiconductor substrate 21 with the second insulating film 24A interposed therebetween at the same time in one process.

With this, it is possible to manufacture a light modulator integrated light-emitting device of high reliability having the third electrode 24 for ground connection in the boundary region between the first electrode 22A and the second electrode 23A, thus improving the reliability of long-distance and large-capacity transmission in an optical communication system.

Next, preferred embodiments of the present invention will be described with reference to the drawings.

The First Preferred Embodiment

A preferred light modulator integrated light-emitting device of the present invention is composed of DFB laser light-emitting element 22 and the light modulation element 23 formed on the n-InP substrate 21 as shown in FIG. 5. There are provided the laser electrode 22A, the ground electrode 24 and the electrode 23A for light modulation in this device.

Namely, the Distributed Feed-Back (DFB) laser light-emitting element 22 is an example of the light-emitting element 12 shown in FIG. 2, and generates a laser light having a wavelength of 1.55 μm. The laser light-emitting element 22 is composed of an n-InGaAsP guide layer 21A, an InGaP active layer 21B, a p-InGaAsP clad layer 21D and a p-InGaAsP contact layer 21E laminated on an n-InP substrate 21.

The facet of the laser light-emitting element 22 concerned has a cleavage plane or a high-reflective coating film 20A. The n-InP substrate 21 is an example of the semiconductor substrate 11, and the element 22 has a laser electrode 22A. The laser electrode 22A is an example of the first electrode 12A, and supplies the electric current for laser light generation.

The light modulation element 23 is an example of the light modulation element 13 shown in FIG. 2, and modulates the laser light. The element 23 is provided on the same n-InP substrate 21 adjacent to the laser light-emitting element 22. The laser light-emitting element 22 is composed of the n-InGaAsP guide layer 21A, an InGaP absorption layer 21C, the p-InGaAsP clad layer 21D and the p-InGaAsP contact layer 21E laminated on the n-InP substrate 21. There are provided high resistance buried layers 21F on both sides of the active layer 21B and the absorption layer 21C.

An anti-reflective coating film 20B is formed on the facet of the element 23, and the element 23 has an electrode 23A for light modulation. The electrode 23A is an example of the second electrode 13A shown in FIG. 2, and supplies a signal for laser modulation.

The ground electrode 24 is an example of the third electrode 14 shown in FIG. 2, and is provided in the boundary region between the laser electrode 22A and the electrode 23A for light modulation separately from these electrodes 22A and 23A. For example, preferred ground electrode 24 is provided on a part of the p-InGaAsP clad layer 21D, the part which is on the light modulation element 23, through a SiO$_2$ film 24A interposed therebetween. The reason of this is that the InGaP active layer 21B does not emit a light when ground electrode 24 is provided on another part of the p-InGaAsP clad layer 21D, the part which is on the laser light-emitting element 22, and therefore, a saturative absorption region is formed. This region will cause degradation of the characteristic and efficiency of this element. With this, the ground electrode 24 is united with the substrate 21. To be more precise, as shown in the sectional view in FIG. 9H, the Ti film 28, the Pt film 29 and the Au film 30 are laminated one after another on the SiO$_2$ film 24A. The Ti film 28, the Pt film 29 and the Au film 30 show an example of the conductive film 14B shown in FIG. 3 and FIG. 4.

Next, connection and arrangement of respective electrodes will be described. FIG. 6 is an electrode wiring diagram of a light modulator integrated light-emitting device. In FIG. 6, a light modulator integrated light-emitting device 100 is installed on a common electrode 101, and is provided with a laser terminal 102 and a light modulator terminal 103 in the periphery thereof. The laser electrode 22A and the terminal 102 of the element 100 are wire-bonded using a gold wire 106. The electrode 23A for light modulation and the terminal 103 are similarly wire-bonded with a gold wire.

Furthermore, the ground electrode 24 is wire-bonded to the common electrode 101 with a gold wire similarly to the above. Besides, a constant current source 104 is connected between the common electrode 101 and the terminal 102, and a modulation signal source 105 is connected between the common electrode 101 and the terminal 103.

Thus, in the first preferred embodiment of a light modulator integrated light-emitting device according to the present invention, the ground electrode 24 is provided in the boundary region between the laser electrode 22A of the laser light-emitting element 22 and the electrode 23A for light modulation of the light modulation element 23 as shown in FIG. 5. As a result, it is possible to shield between the laser light-emitting element 22 and the light modulation element 23 electrostatically by connecting the ground electrode 24 to the common electrode 101 and to ground.

Figure 7:
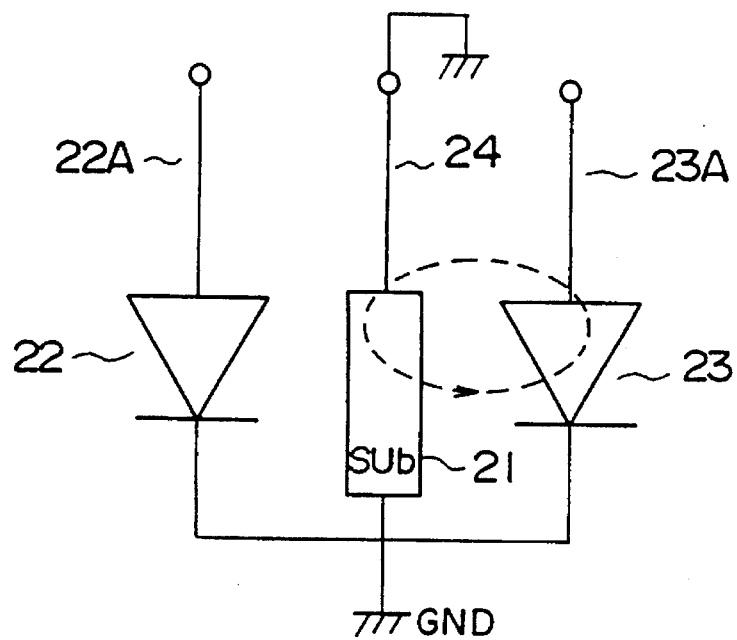
FIG. 7 is an equivalent circuit diagram for explaining the function of a ground electrode of the light modulator integrated light-emitting device shown in FIG. 5.

Namely, in FIG. 7, even when a modulation signal having a high frequency in Ghz is supplied to the electrode 23A for light modulation, a modulation signal that is being induced from the electrode 23A for light modulation to the laser electrode 22A is shielded electrostatically by means of the ground electrode 24. As a result, electrical isolation between the laser electrode 22A and the electrode 23A for light modulation is intensified by the ground electrode 24, thus making it possible to supply a constant current having no fluctuation to the laser electrode 22A, and a modulated light having a stable oscillation wavelength with no fluctuation is outputted from the light modulation element 23.

With this, the modulated light outputted to an optical fiber from the light-emitting element 100 is stabilized. Thus, even when the isolation distance between the laser electrode 22A and the electrode 23A for light modulation is reduced, it is possible to sufficiently meet the requirements for micronization and high integration of the light modulator integrated light-emitting device by adopting the structure according to the present invention.

Figure 8:
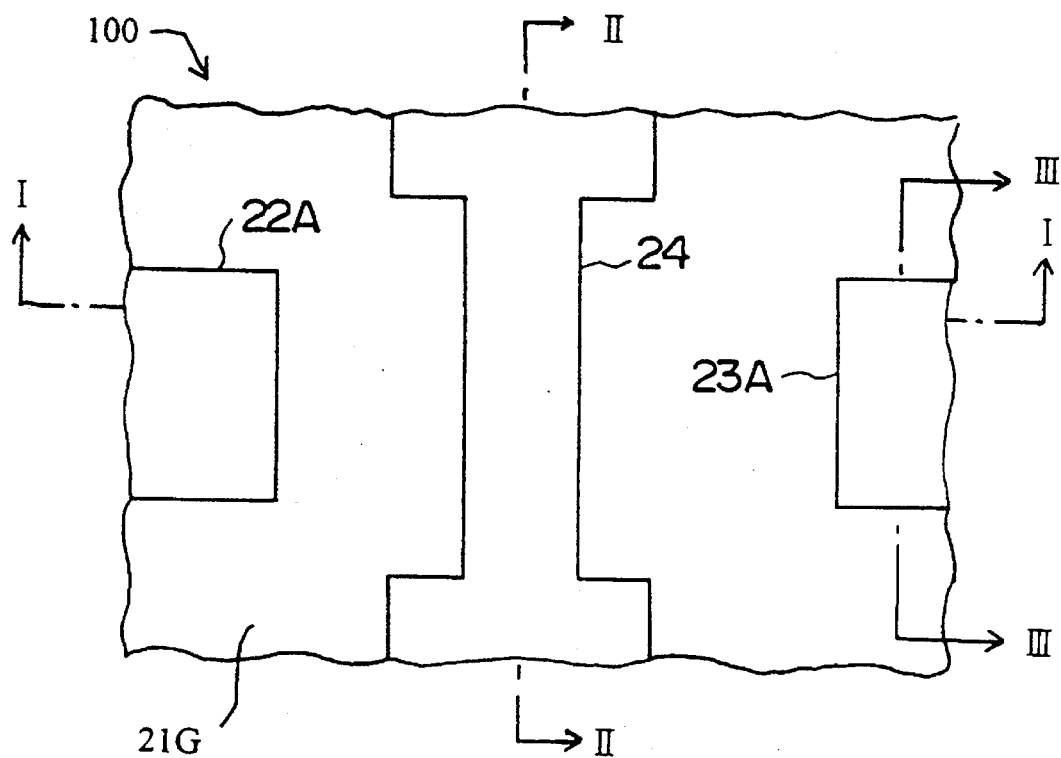
FIG. 8 is a plan view showing a laser electrode, a light modulator electrode and a ground electrode of the light modulator integrated light-emitting device shown in FIG. 5.

Next, a method of forming a light modulator integrated light-emitting device according to the first preferred embodiment of the present invention will be described. Here, the process of forming the section taken along a line I—I of the laser electrode 22A, the ground electrode 24 and the electrode 23A for light modulation such as those shown in a plan view of the light modulator integrated light-emitting device 100 in FIG. 8 will be described laying stress thereon while supplementing the process of forming the section taken along a line II—II of the ground electrode 24 and the process of forming the section taken along a line III—III of the electrode 23A for light modulation.

Figure 9A:
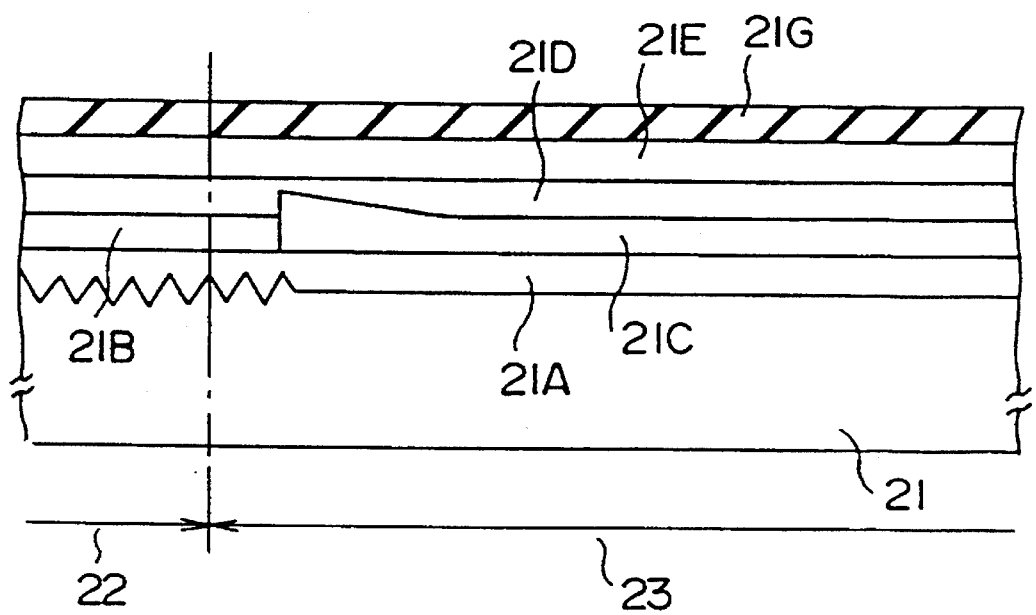
FIG. 9A to FIG. 9H are process diagrams of forming the light modulator integrated light-emitting device shown in FIG. 5, and show sectional views taken along a line I—I of respective electrode planes shown in FIG. 8.

When a light modulator integrated light-emitting device having the laser electrode 22A, the electrode 23A for light modulation and the ground electrode 24 such as shown in FIG. 5 is formed, a SiO$_2$ passivation film (hereinafter simply referred to as a SiO$_2$ film) 21G having a film thickness of approximately several thousand Å is formed first on the n-InP substrate 21 as shown in FIG. 9A. The SiO$_2$ film 21G is formed by a sputtering method or a CVD method.

Here, the substrate 21 is an example of the semiconductor substrate 11 shown in FIG. 2. The light-emitting element 22 for laser light generation and the light modulation element 23 for laser modulation are formed in advance on the substrate 21. The light-emitting element 22 is formed by laminating, for example, the n-InGaAsP guide layer 21A having a wavelength of approximately 1.1 μm, the InGaP active layer 21B having a wavelength of approximately 1.55 μm, the p-InGaAsP clad layer 21D and the p-InGaAsP contact layer 21E having a dope quantity of approximately $1 \times 10^{19}$ cm$^{-3}$ or more.

Figure 10A:
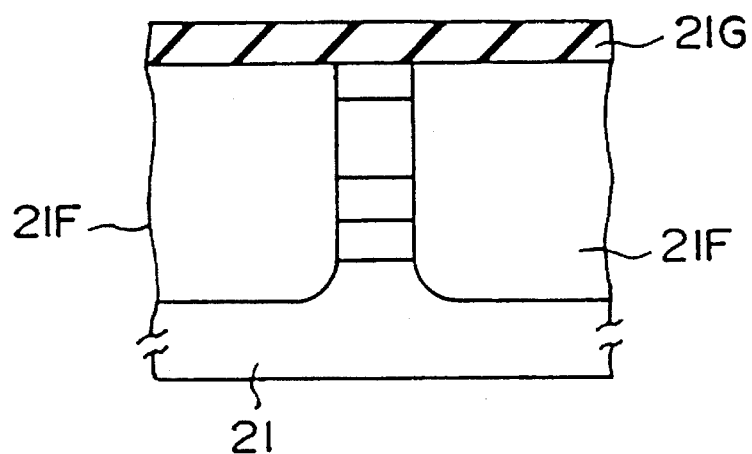
FIG. 10A to FIG. 10D are process diagrams of forming the light modulator integrated light-emitting device shown in FIG. 5, and show sectional views taken along a line II—II of the ground electrode plane shown in FIG. 8.

Further, the light modulation element 23 has an InGaP absorption layer 21C having a wavelength of 1.55 μm in lieu of the active layer 21B. FIG. 10A shows a sectional view seen from the outgoing direction of the laser light. In FIG. 10A, buried layers 21F of high resistance are provided on both sides of the active layer 21B and the absorption layer 21C.

Figure 9B:
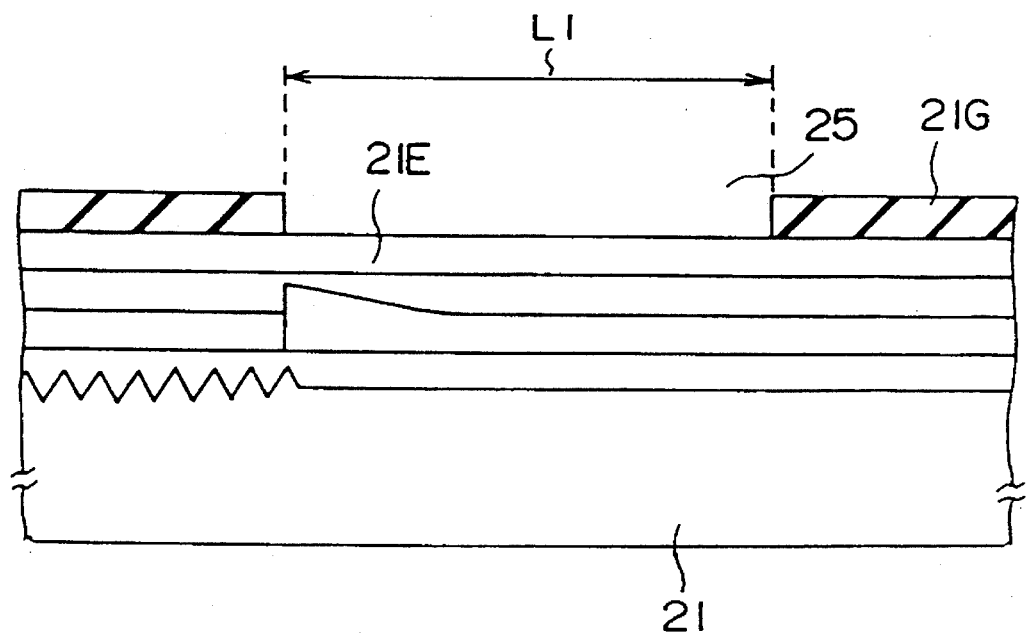
Figure 10B:
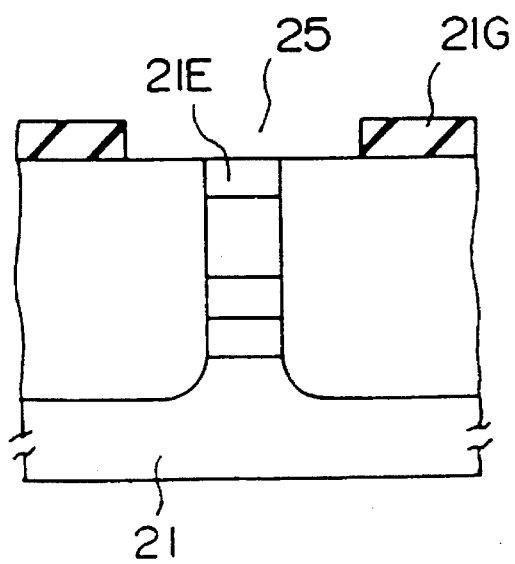

Next, as shown in FIG. 9B, patterning is applied to the SiO$_2$ film 21G on the substrate 21, and an opening portion (a first opening portion) 25 for current constriction is formed. Patterning is applied to a photolithography method using a resist film as a mask. With this, as shown in FIG. 10B, the opening portion 25 where a part of the contact layer 21E and the buried layer 21F on the substrate 21 is exposed is formed.

Figure 9C:
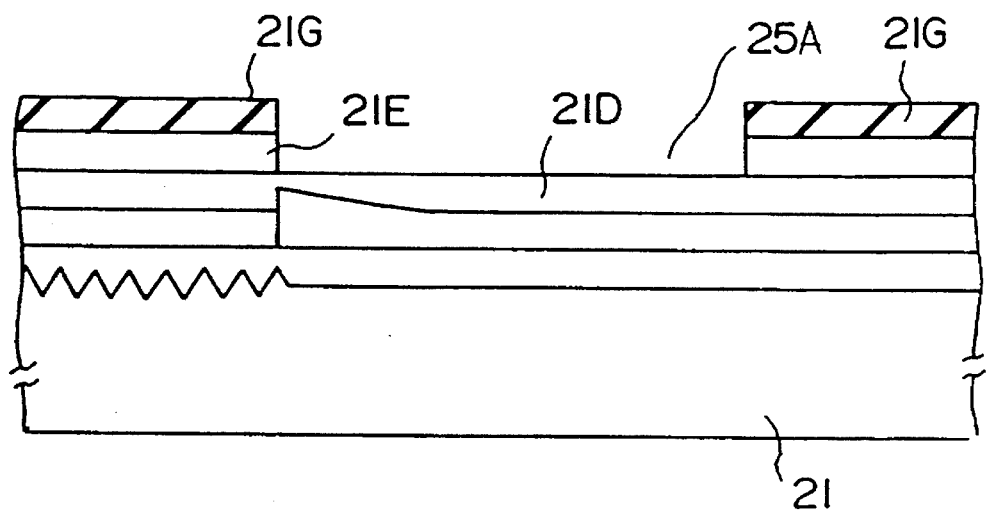
Figure 10C:
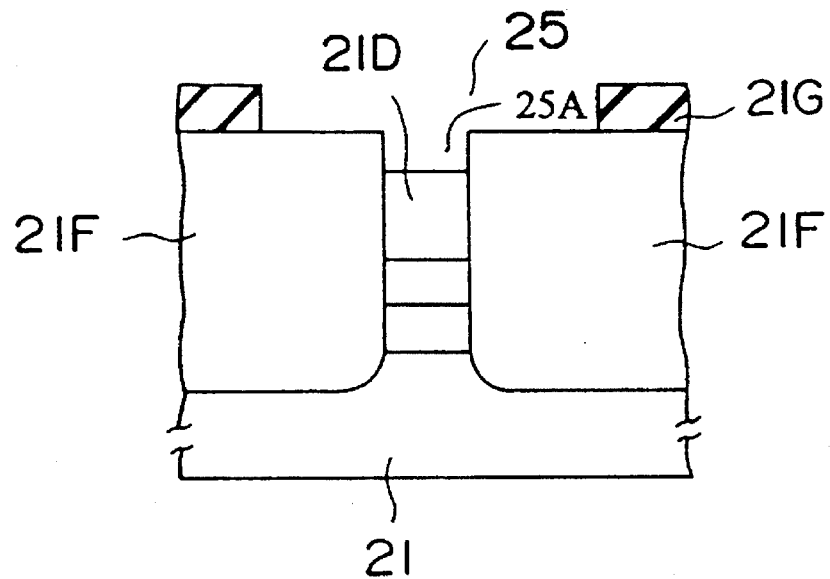
Figure 10D:
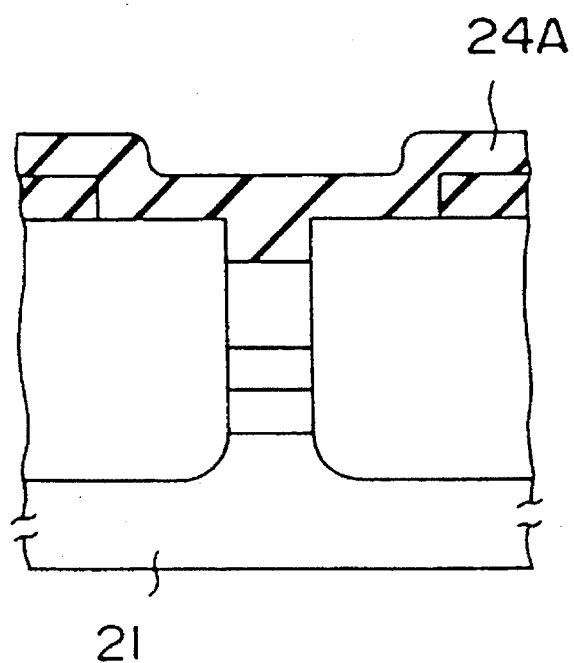

Thereafter, as shown in FIG. 9C, the contact layer 21E exposed in the opening portion 25 is etched further locally using a resist film as a mask, and the clad layer 21D is exposed locally in the boundary region between the light-emitting element 22 and the light modulation element 23. The selective etching method in this case is performed using a H$_2$SO$_4$ etchant for instance. With this, as shown in FIG. 10C, the buried layers 21F remain as they are on both sides of the light travelling direction, and the opening portion 25 having a groove portion 25A where the clad layer 21D is exposed is formed.

Figure 9D:
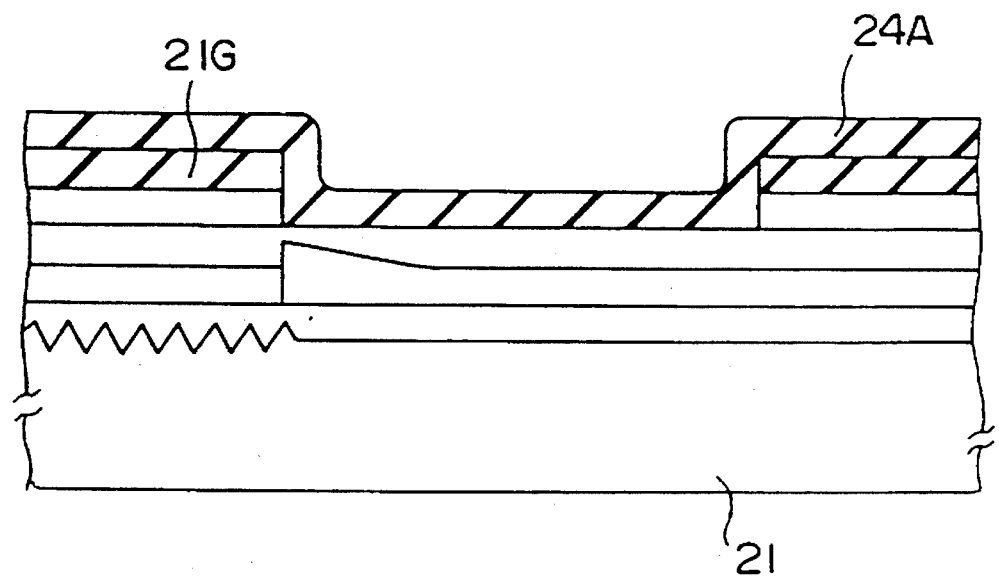

Then, as shown in FIG. 9D, a SiO$_2$ film 24A is formed on the SiO$_2$ film 21G and the clad layer 21D in the opening portion 25. The film thickness of the SiO$_2$ film 24A is approximately several thousand Å. With this, the SiO$_2$ film 24A is filled in the opening portion 25 having a groove portion 25A such as shown in FIG. 10C.

Figure 9E:
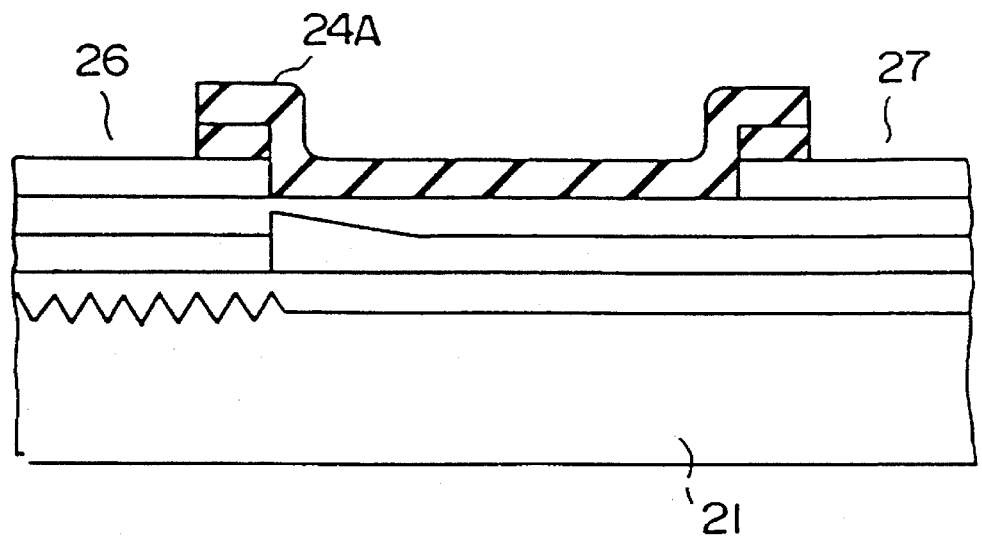
Figure 11A:
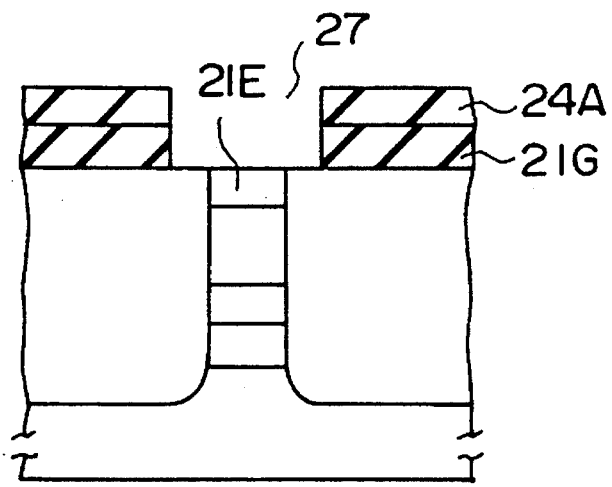
FIG. 11A to FIG. 11D are process diagrams of forming the light modulator integrated light-emitting device shown in FIG. 5, and show sectional views taken along a line III—III of the ground electrode plane shown in FIG. 8.

Thereafter, as shown in FIG. 9E, patterning is applied to the SiO$_2$ film 21G and the SiO$_2$ film 24A, thereby to form two opening portions (a second and a third opening portions) 26 and 27 for letting electrodes pass therethrough are formed in the light-emitting element 22 and the light modulator 23. The patterning is applied by a photolithography method. With this, the opening portion 27 where the contact layer 21E and the high resistance buried layer 21F such as shown in FIG. 11A are exposed is formed.

Figure 9F:
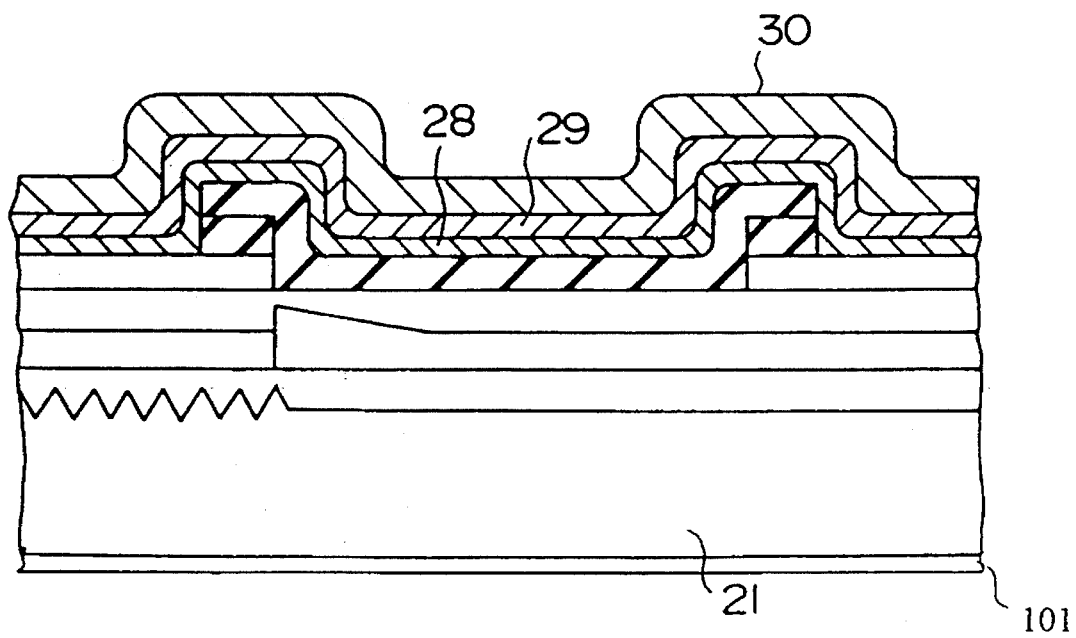

Next, as shown in FIG. 9F, respective electrodes are formed on the SiO$_2$ film 24A and the contact layer 21E, and the common electrode 101 is formed under the substrate 21. For example, a titanium (Ti) film 28 and a platinum (Pt) film 29 are formed on the whole surface of the substrate 21. The Ti film 28 and the Pt film 29 show examples of the contact barrier metals, and the Ti film 28 has a film thickness of approximately several thousand Å. The Pt film 29 has a film thickness of approximately several thousand Å. Both contact barrier metals are formed by a vapor deposition method. These barrier metals may also be formed by a sputtering method.

Figure 11B:
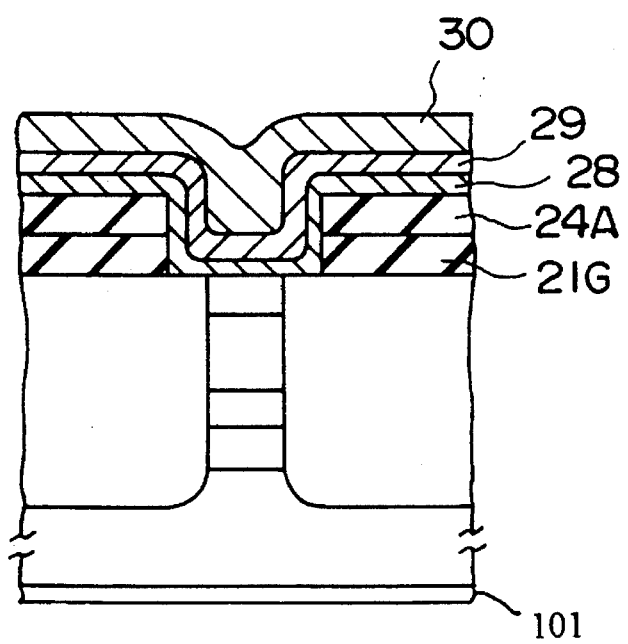

With this, the Pt film 29 becomes a contact barrier layer in the opening portion 27 as shown in FIG. 11B. Furthermore, a gold (Au) film 30 is formed on the Pt film 29. The Au film 30 is formed by a plating method for instance.

Figure 9G:
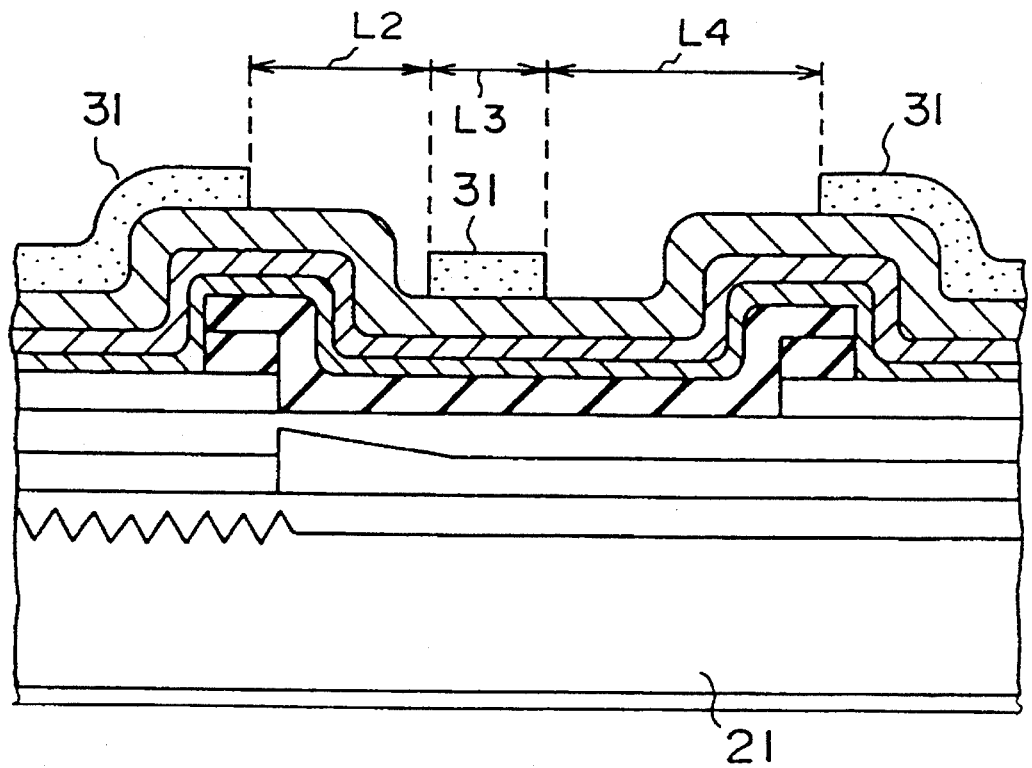
Figure 11C:
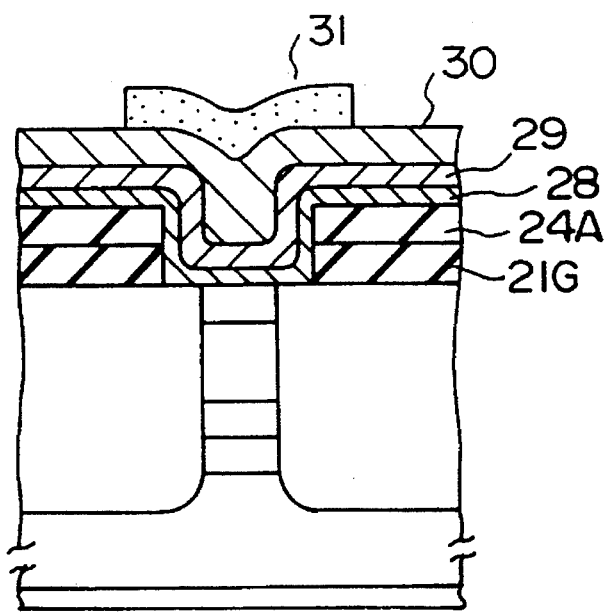

Thereafter, as shown in FIG. 9G, a resist film 31 is applied onto the Au film 30 and is exposed and developed, and patterning is applied thereto. The patterning is applied to the resist film 31 so that the length (width) L3 of the ground electrode 24 is set to approximately 5 to 50 μm, the isolation distance L2 between the laser electrode 22A and the ground electrode 24 is set to approximately 5 to 50 μm, and the isolation distance L4 between the ground electrode 24 and the electrode 23A for light modulation is set to approximately 5 to 100 μm. Besides, the width of the electrode 23A for light modulation is determined in accordance with the width of the resist film 31 as shown in FIG. 11C. Here, FIG. 11C shows a sectional view taken along a line III—III of the region where the electrode for laser light modulation is formed.

Figure 9H:
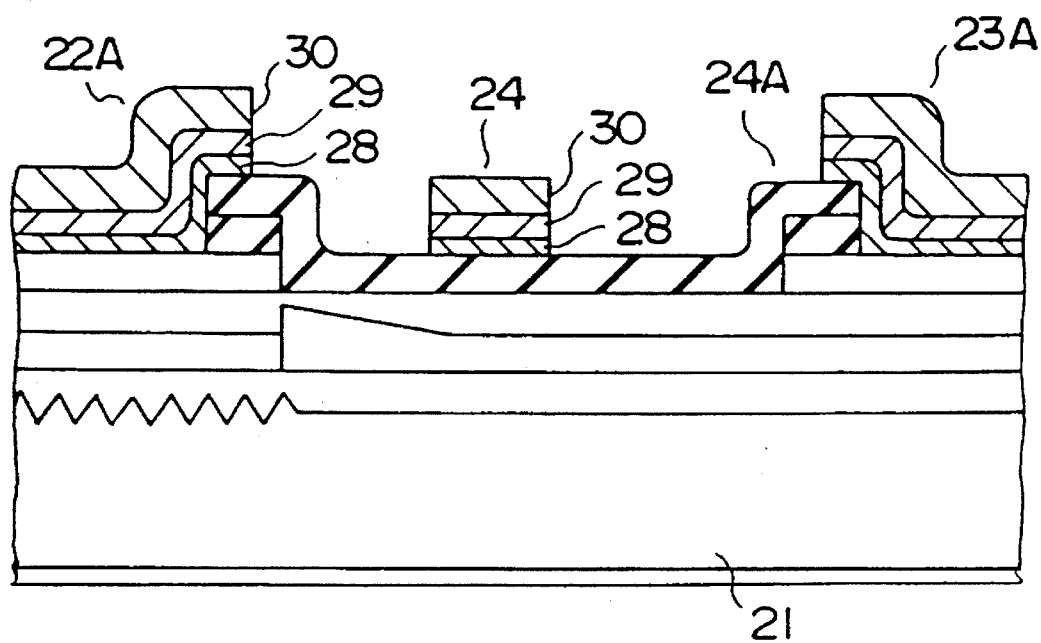
Figure 11D:
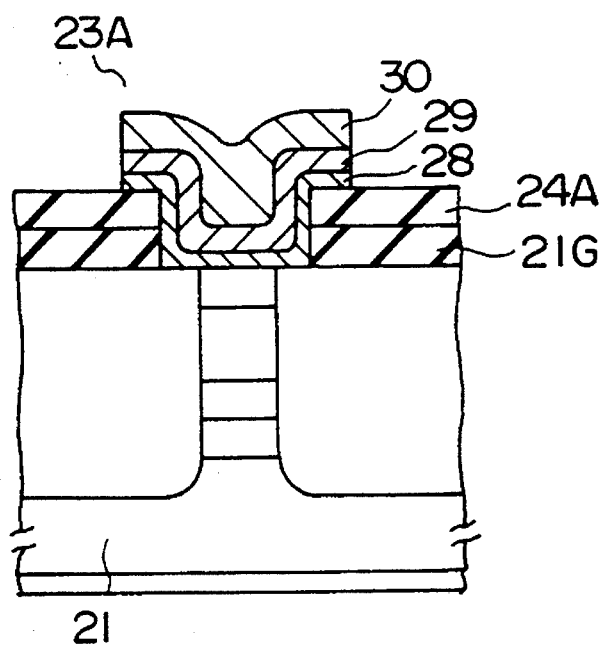

Thereafter, as shown in FIG. 9H, surplus Au film 30, Pt film 29 and Ti film 28 are removed by etching. Thus, the laser electrode 22A, the electrode 23A for light modulation and the ground electrode 24 of the light modulator integrated light-emitting device are completed. Besides, the section of the electrode 23A for light modulation is shown in FIG. 11D.

Thus, according to the method of manufacturing a light modulator integrated light-emitting device according to the first preferred embodiment of the present invention, there are included processes of forming the Ti film 28, the Pt film 29 and the Au film 30 on the impurity semiconductor layer 21E of the light-emitting element 22, on the impurity semiconductor layer 11E of the light modulation element 23, and on the insulating film 24A formed over both regions of the light-emitting element 22 and the light modulation element 23, respectively.

Thus, it is possible, by applying patterning to the Ti film 28, the Pt film 29 and the Au film 30, to form the laser electrode 22A on the contact layer 21E of the substrate 21, to form the light modulation electrode 23A on the contact layer 21E of the substrate 21, and to form the ground electrode 24 on the clad layer 21D of the substrate 21 with the SiO$_2$ film 24A interposed therebetween at the same time in one process.

With this, it is possible to manufacture a light modulator integrated light-emitting device of high reliability having the ground electrode 24 in the boundary region between the laser electrode 22A and the light modulation electrode 23A. The reliability in long-distance and large-capacity transmission is improved by applying a light-emitting device having such a structure to an optical communication system.

The Second Preferred Embodiment

Being different from the first preferred embodiment, the SiO$_2$ passivation film 24A is omitted in a second preferred embodiment.

Figure 12:
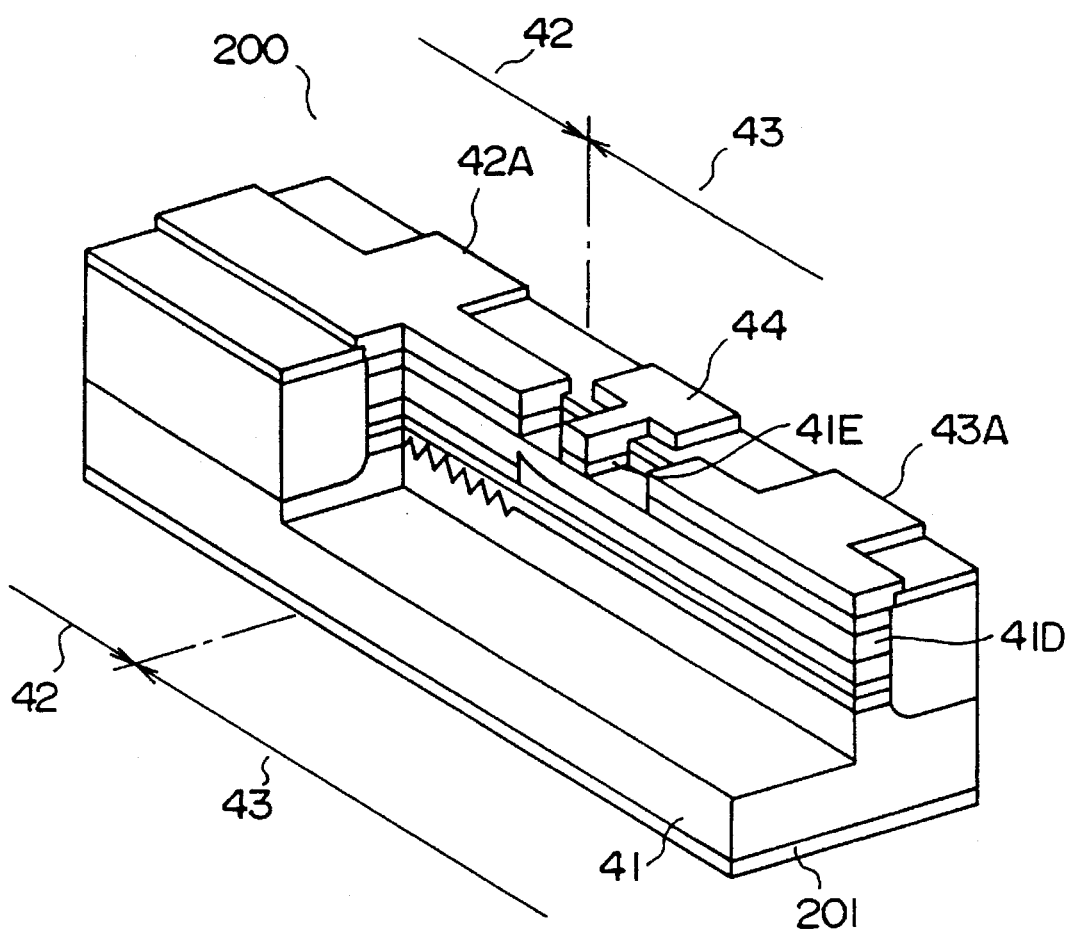
FIG. 12 is a perspective view for explaining a structure of a light modulator integrated light-emitting device according to a second preferred embodiment of the present invention.

Namely, in a second light modulator integrated light-emitting device 200 of the present invention, a DFB laser light-emitting element 42 and a light modulation element 43 are formed on the same n-InP substrate 41, and a laser electrode 42A, a ground electrode 44 and a light modulation electrode 43A are provided as shown in FIG. 12. It seems that there is a short circuit between the laser electrode 42A and the light modulation electrode 43A. However, this does not happen because the resistance of an p-InGaAsP clad layer 41D is sufficiently high, that is, about $1 \times 10^{-3}$ to $1 \times 10^{-2} \Omega \cdot m$. The ground electrode 44 is provided in the boundary region between the laser electrode 42A and the light modulation electrode 43A and on a p-InGaAsP contact layer 41E on the n-InP substrate 41.

The ground electrode 44 is composed of the Ti film 28, the Pt film 29 and the Au film 30 laminated successively similarly to the first preferred embodiment. With this, a state that the ground electrode 44 is united directly with the semiconductor layer 41E is presented.

Besides, the method of manufacturing a light modulator integrated light-emitting device according to the second preferred embodiment of the present invention is the same as that in the first preferred embodiment except the process for the SiO$_2$ film 24A. Hence, the description thereof is omitted.

Thus, according to the light modulator integrated light-emitting device according to the second preferred embodiment of the present invention, the ground electrode 44 is provided in the boundary region between the laser electrode 42A of the laser light-emitting element 42 and the light modulation electrode 43A of the light modulation element 43, and the ground electrode 44 is connected to a common electrode 201 of the element 200 and to ground similarly to the first preferred embodiment as shown in FIG. 12. Therefore, a state that the boundary region between the laser light-emitting element 42 and the light modulation element 43 is shielded electrostatically is presented.

As a result, even when a high frequency signal is supplied to the light modulation electrode 43A, a modulation signal that is being induced from the light modulation electrode 43A to the laser electrode 42A is shielded electrostatically by the ground electrode 44, and electrical isolation between the laser electrode 42A and the light modulation electrode 43A is intensified by the ground electrode 44, thus making it possible to supply a predetermined constant current to the laser electrode 42A, and a modulated light having a stable oscillation wavelength with no fluctuation is outputted from the light modulation element 43.

With this, there is provided a light modulator integrated light-emitting device that outputs a stable modulated light from the light-emitting element 200 to an optical fiber similarly to the first preferred embodiment, and further, it is possible to sufficiently meet the requirements for micronization and high integration of the light-emitting device.

What is claimed is:

1. A light modulator integrated light-emitting device comprising:

a light-emitting element formed on a semiconductor substrate;

a light modulation element formed on the semiconductor substrate and which is optically connected to said light-emitting element;

a first electrode formed on said light-emitting element;

a second electrode formed on said light modulation element; and a third electrode that is formed between said first electrode and said second electrode in an electrically isolated state with respect to these electrodes, and is applied with constant voltage.

2. The light modulator integrated light-emitting device according to claim 1, wherein said third electrode is formed on a semiconductor layer formed in both regions of said light-emitting element and said light modulation element through an insulating film.

3. The light modulator integrated light-emitting device according to claim 1, wherein said third electrode is formed in direct contact with the top of a semiconductor layer formed in both regions of said light-emitting element and said light modulation element.

4. The light modulator integrated light-emitting device according to claim 1, wherein a common electrode is formed under said semiconductor substrate.

5. The light modulator integrated light-emitting device according to claim 1, wherein said third electrode is connected to said common electrode and to ground.

6. The light modulator integrated light-emitting device according to claim 1, wherein said first electrode is formed on a contact layer of said light-emitting element, said second electrode is formed on a contact layer of said light modulation element, the contact layer under said first and second electrodes is electrically isolated in a boundary region, and said third electrode is formed on the semiconductor layer in an isolated boundary region through an insulating film.

7. A method of manufacturing a light modulator integrated light-emitting device, comprising the steps of:

removing locally a semiconductor layer containing impurities extending over both a light-emitting element and a light modulation element formed on a semiconductor substrate so as to form an isolation groove between said light emitting and said modulating elements;

forming an insulating film in the isolation groove of said semiconductor substrate; and forming electrically isolated conductive films on the semiconductor layer containing impurities of said light-emitting element, on the semiconductor layer containing impurities of said light modulation element, and on said insulating film, respectively.

* * * * *

UNITED STATES PATENT AND TRADEMARK OFFICE
CERTIFICATE OF CORRECTION

PATENT NO. : 5,481,559
DATED : January 2, 1996
INVENTOR(S) : Hiromitsu KAWAMURA

It is certified that error appears in the above-indentified patent and that said Letters Patent is hereby corrected as shown below:

Column 2, line 57, change "Groove" to --groove--.

Column 9, line 64, delete "11E" and insert --21E-- therein.

Signed and Sealed this

Fourth Day of June, 1996

*Attest:*

BRUCE LEHMAN

*Attesting Officer*     Commissioner of Patents and Trademarks